United States Patent [19]

Ferrando

[11] Patent Number: 5,091,362
[45] Date of Patent: * Feb. 25, 1992

[54] METHOD FOR PRODUCING SILVER COATED SUPERCONDUCTING CERAMIC POWDER

[75] Inventor: William A. Ferrando, Arlington, Va.

[73] Assignee: The United States of America as represented by the Secretary of the Navy, Washington, D.C.

[*] Notice: The portion of the term of this patent subsequent to Jan. 29, 2008 has been disclaimed.

[21] Appl. No.: 597,474

[22] Filed: Oct. 10, 1990

Related U.S. Application Data

[63] Continuation-in-part of Ser. No. 389,220, Aug. 2, 1989, Pat. No. 4,988,673.

[51] Int. Cl.$^5$ .................. H01L 39/12; B05D 5/12
[52] U.S. Cl. ........................ 505/1; 505/700; 505/725; 505/785; 427/62; 427/123; 427/125; 427/217; 427/229
[58] Field of Search .............. 505/1, 700, 725, 785, 505/737; 427/62, 123, 125, 217, 226, 229

[56] References Cited

U.S. PATENT DOCUMENTS

| | | | |
|---|---|---|---|
| 4,826,808 | 5/1989 | Yurek et al. | 505/1 |
| 4,892,861 | 1/1990 | Ray | 505/1 |
| 4,988,673 | 1/1991 | Ferrando | 505/1 |

Primary Examiner—Shrive Beck
Assistant Examiner—Roy V. King
Attorney, Agent, or Firm—Kenneth E. Walden; Roger D. Johnson

[57] ABSTRACT

A process for silver coating superconducting ceramic powder by
(1) mixing $AgNO_3$ with the superconducting ceramic powder particles;
(2) melting the $AgNO_3$ so that it wets and forms a uniform coating over the surfaces of the particles; and
(3) decomposing the $AgNO_3$ to form a thin, uniform coating of silver metal on the surfaces of the particles.

The product is a loose powder of superconducting ceramic particles which are uniformly coated with silver metal. The powder can be cold worked (e.g., swaged, forged, etc.) to form superconducting structures such as rods or wires.

9 Claims, 5 Drawing Sheets

AS RECEIVED

MAG: 5,000 X

Ag COATED

MAG: 5,000 X

METHOD FOR PRODUCING SILVER COATED SUPERCONDUCTING CERAMIC POWDER

This application is a continuation-in-part of U.S. application Ser. No. 389,220 filed Aug. 2, 1989 now U.S. Pat. No. 4,988,673.

BACKGROUND OF THE INVENTION

This invention relates to metal/ceramic composites and more particularly to silver metal-coated superconducting ceramic powders.

Since the advent of the new generation high Tc ($\sim 77°$ K.) ceramic superconducting materials, prodigious efforts have been expended to fabricate the same into usable wire form.

The relative metallurgical intractability of these ceramic compounds has been described as follows:

". . . They are reactive, unstable, brittle, unable to support any significant stress, unable to be formed and reprocessed, and not easily joined. The powder form of the compound used as the raw material for the fabrication process is itself not easily produced with consistency."

"There is a great deal of uncertainty about compositions and structures which superconduct (and remain superconducting after processing), but clearly, in the new materials, oxygen stoichiometry and oxygen partial pressure during processing are crucial. Attempts to combine these powders with metal-matrix support systems such as copper have been unsuccessful because elevated-temperature fabrication in the rich oxygen environment these powders require causes rapid oxidation of the metals and rapid degradation of the powder, including oxygen depletion of the superconducting lattice."

[Murr, L.E. Hare, A.W., Eror, N. G. "introducting: The metal-Matrix High-Temperature Superconductor, " Advanced Materials & Processes, Inc., Metal Progress Oct. 1987.]

It would be desirable to provide a process by which intimate bonding of the superconductive ceramic particles with a suitable workable metal of good electrical conductivity is achieved while maintaining the superconductive properties of the ceramic.

SUMMARY OF THE INVENTION

Accordingly, an object of this invention is to provide a new method of incorporating superconducting ceramics into a workable metal matrix without loss of the superconductive properties.

Another object of this invention is to produce a new superconductive composite powder capable of being worked by techniques such as forging, swaging, drawing, etc.

A further object of this invention is to provide a composite powder in which the superconducting ceramic particles are protected against chemical degradation.

These and other objects of this invention are achieved by providing a process for silver coating superconducting ceramic powders comprising:

(1) mixing $AgNO_3$ with superconducting ceramic powder particles;

(2) melting the $AgNO_3$ so that it wets and forms a uniform coating over the surfaces of the particles; and (3) decomposing the $AgNO_3$ to form a thin, uniform coating of silver metal on the surfaces of the particles.

The product is a loose powder of superconducting ceramic particles which are uniformly coated with silver metal. The powder can be cold worked (e.g., swaged, forged, etc.) to form superconducting structures such as rods or wires.

BRIEF DESCRIPTION OF FIGURES

A more complete understanding of the invention and many of the attendant advantages thereto will be readily appreciated as the same becomes better understood by reference to the following detailed description when consider in connection with the accompanying figures wherein.

DETAILED DESCRIPTION OF THE PREFERRED EMBODIMENT

Figure 1A:
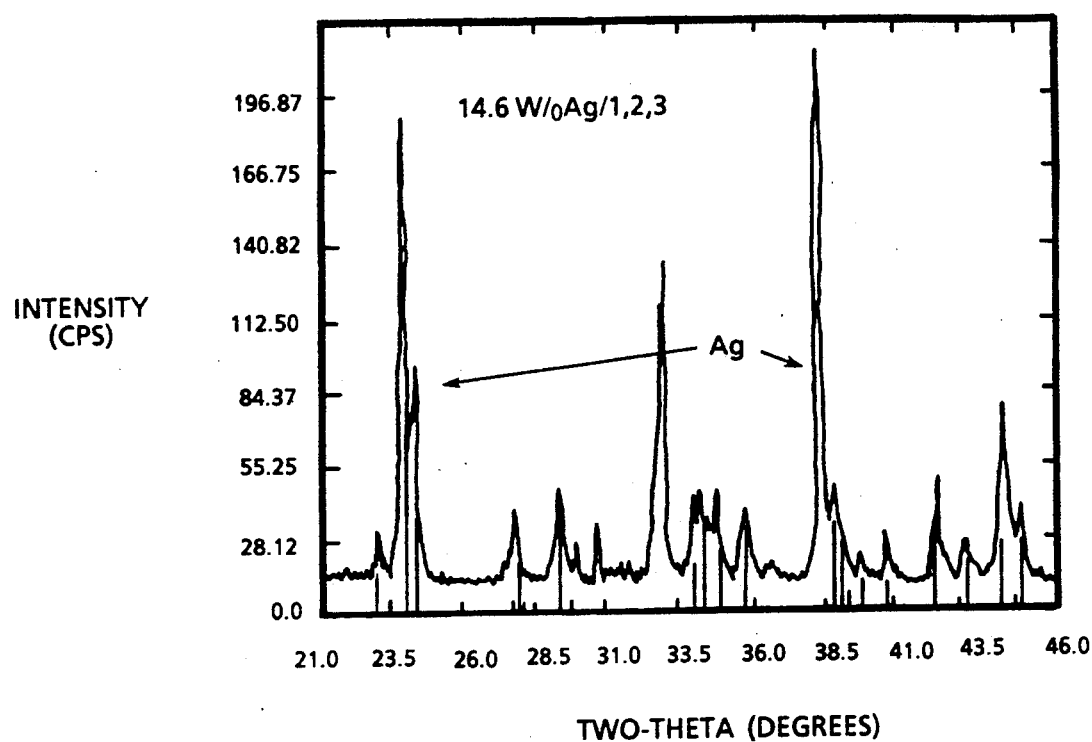
FIGS. 1A, 1B, and 1C show powder X-ray spectra for silver metal coated $YBa_2Cu_3O_{7-x}$ powder composites containing (A) 14.6, (B) 7.9, and (C) 2.09 weight percent silver and are discussed in example 1.

The process of this invention quickly and inexpensively produces uniform, thin coatings of silver metal on particles of ceramic superconductors. The process operates at temperatures well below the melting points of the ceramic materials and leaves their superconducting properties undisturbed. These silver metal coated particles have good cold working properties and may be swaged, drawn, pressed, etc., to form wires, rods, or other useful forms. In contrast to the brittle ceramics, the silver matrix or coating produces a flexible, malleable material. The uniform silver metal coating also provides some protection for the superconductor material against the environment.

The key to the present process is the special properties of $AgNO_3$. At $212°$ C. silver nitrate melts and forms a clear, low viscosity liquid with excellent wetting properties. The molten $AgNO_3$ quickly spreads out to form a uniform coating on the surfaces of the ceramic particles. Moreover, the silver nitrate decomposes at $444°$ C. leaving a thin, uniform coating of silver metal. Note that this decomposition temperature of silver nitrate is more than $500°$ C. below the melting point of $YBa_2Cu_3O_{7-x}$. Similarly, it is well below the melting point of the other superconducting ceramics.

Reagent (ACS) grade $AgNO_3$ is preferred for this process. Less pure $AgNO_3$ may introduce undesirable impurities.

This process is designed for use on ceramic superconductors. For example, it can be used to coat yttrium (Y) based ceramic superconductors such as $YBa_2Cu_3O_{7-x}$, bismuth (Bi) based ceramic superconductors such as $Bi_{.7}Pb_{.3}SrCaCu_{1.8}O_x$, and thallium (Tl) based superconductors such as $Tl_2Ba_2Ca_2Cu_3O_{7-x}$. Molten $AgNO_3$ does not chemically attack or adversely affect these ceramic superconductors. In fact, because AgNO$_3$ is an oxidizer, it helps to maintain the oxygen content in these ceramics.

The products of the process are loose powders made up of ceramic particles which are uniformly coated with silver metal. This powder composite product is composed of from about 1 to about 25, and preferably from 1 to 15, and more preferably from 10 to 15 weight percent of silver metal with the ceramic superconducting material being the remainder of the composite.

The amounts of AgNO$_3$ and superconducting ceramic powder in the starting mixture are calculated as follows. The amount of silver metal needed is calculated from the amount of superconducting ceramic powder to be coated and the desired silver metal/ceramic composition. The weight of AgNO$_3$ to be used in the starting mixture is then calculated by multiplying the weight of silver metal needed by 1.5748 (mol. wt. AgNO$_3$ divided by at. wt. Ag).

In the first step of the process, the AgNO$_3$ and superconducting ceramic powder are mixed together. If the silver metal/ceramic composite is to contain 10 to 25 weight percent of silver, the AgNO$_3$ and superconducting ceramic particles can simply be mixed together without using any solvents. (However if the silver metal content is to be less than 10 weight percent, it will be difficult if not impossible to wet all the ceramic particles in the amount of molten AgNO$_3$ available.) The mixing of AgNO$_3$ and superconductor ceramic powder will preferably be done by thoroughly mixing the AgNO$_3$ and superconducting powders together before any melting of AgNO$_3$. The temperatures of both the AgNO$_3$ and the superconducting ceramic powders will necessarily be below the melting point of AgNO$_3$. This mixing will usually be done at ambient or room temperature.

Another method is to mix molten AgNO$_3$ with the superconducting ceramic powder. The molten AgNO$_3$ may be added to the superconducting ceramic powder or the superconducting ceramic powder may be added to the molten AgNO$_3$. Whichever procedure is used, the molten AgNO$_3$ and superconducting ceramic powder must be vigorously agitated (e.g., stirred) during the mixing to minimize agglomeration of the particles. During the mixing process the temperature of the molten AgNO$_3$ is kept above the melting point of AgNO$_3$ and below the decomposition temperature of AgNO$_3$. Before mixing the superconducting ceramic powder is at a temperature below the decomposition temperature of AgNO$_3$, preferably at a temperature from room temperature to the melting point of AgNO$_3$, but more preferably at a temperature above the melting point of AgNO$_3$ but below the decomposition temperature of AgNO$_3$.

A still less preferred method of mixing is to add solid AgNO$_3$ powder to superconducting powder which is maintained at a temperature above the melting point of AgNO$_3$ but below the decomposition temperature of AgNO$_3$. The AgNO$_3$ powder will be a at temperature of less than the melting point of AgNO$_3$, more likely from room temperature to less than the melting point of AgNO$_3$, and most likely at room temperature. This mixing procedure will require very vigorous agitation to minimize agglomeration. Conventional methods such as stirring and shaking will not be sufficient. Special apparatus such as a Cyclone furnace or a fluidized bed furnace will be needed. This procedure is more expensive and the results are less promising than the methods described above.

A dangerous and unsatisfactory procedure would be to heat the superconducting powder to a high temperature (>600° C.), remove it from the heat source, and then quickly add AgNO$_3$ powder. There is a danger that the AgNO$_3$ may react violently, resulting in hot, caustic AgNO$_3$ being spattered from the mixture. Even if this is avoided, the first AgNO$_3$ particles contacting the hot superconducting ceramic particles will rapidly melt and then decompose, leaving small particles Ag metal. Particles following will not receive sufficient heat, resulting in clumping in the powder.

A procedure that will work for the entire range of from about 1 to about 25 weight percent silver is to dissolve the AgNO$_3$ in a suitable solvent. Just enough of the solvent is used to make a paste that assures the wetting of all ceramic particle surfaces with the AgNO$_3$ solution. The solvent is then removed, leaving the AgNO$_3$ deposited as small crystals over the surfaces of the particles. Note that a suitable solvent is one that (1) dissolves AgNO$_3$, (2) can be evaporated at relatively low temperatures without leaving a residue, and (3) will not react with or damage the superconducting ceramic. Distilled water (AgNO$_3$ solubility about 120 g/100 ml at 0° C.) will work well for bismuth or thallium based superconducting ceramics. However, water damages YBa$_2$Cu$_3$O$_{7-x}$. Ethylene glycol, HOCH$_2$CH$_2$OH, (AgNO$_3$ solubility about 75 g/100 ml) is the solvent of choice. It is safe for superconducting ceramics (including YBa$_2$Cu$_3$O$_{7-x}$). However, care must be taken in removing the ethylene glycol. The temperature should be kept below 75° C. and preferably should be in the range of from 50° C. to 65° C. At high temperatures the ethylene glycol acts as fuel and may catch fire.

In the second step of the process, the AgNO$_3$ is heated at a temperature above its melting point (212° C.) and below its decomposition temperature (444° C.) until it melts and wets the superconducting ceramic particle surfaces. This wetting step occurs during the mixing step when molten or liquid AgNO$_3$ is mixed with the superconducting ceramic powder. And it substantially occurs during the mixing step when AgNO$_3$ is added to superconducting powder which is maintained at a temperature above the melting point of AgNO$_3$. As a practical matter, when the AgNO$_3$ and superconducting ceramic powders are mixed at a temperature below the melting point of AgNO$_3$ or when a solvent is used to deposit AgNO$_3$ crystals on the superconducting ceramic particles, this wetting step will occur automatically while the AgNO$_3$ and the superconducting ceramic particles are being heated up to the AgNO$_3$ decomposition temperature. When the AgNO$_3$ melts on a particle, the molten AgNO$_3$ seeks to cover as wide an area as possible. As a result, the AgNO$_3$ wets the particle surface forming a uniform coating.

In the third and final step of the process, the AgNO$_3$ is decomposed to form a thin, uniform coating of silver metal over the surfaces of the superconducting ceramic particles. The reaction sequence is:

$$AgNO_3 \rightarrow AgO + NO_2$$

$$2AgO \rightarrow 2Ag + O_2$$

The decomposition step may be run at a temperature of from the decomposition temperature of AgNO$_3$ (444° C.) up to 50° C. less than the melting point of the superconducting ceramic. As a practical matter there is no need to use very high temperatures. A preferred temperature range from the decomposition step is from 450° C. to 550° C., with from 450° C. to 500° C. being more preferred. After the decomposition is complete, the coated particles are cooled to room temperature.

The silver metal-coated superconducting particles produced are in the form of a loose powder. In contrast to silver coating produced from mixtures of fine silver powder and the superconducting ceramic powder, the coating produced by this process are smooth and uniform. Agglomeration of the silver coated ceramic particles may occur when the silver metal content of the composite is near 25 weight percent. This can be correcting by ball milling to break the particles apart. This creates jagged uneven spots in the silver metal coating. However, because silver metal is soft, the ball milling process smooths and reforms the silver coatings.

Silver metal-coated particles produced by this process have been used to produce superconducting pellets by pressing. They also have been used to produce rods and wires by packing in copper or silver tubes and swaging. Explosive compaction and extrusion have been attempted.

The silver metal-coated superconducting particles produced by this process are characterized by uniform coatings which are preferably from about 0.02 to about 10 microns thick, and more preferably from 0.05 to 1 micron thick.

Chemical vapor deposited coatings on such powders, if available, should look similar. However the penetration of silver into the small cavities of individual particles (see FIGS. 2A and 2B) might not be as complete. This is simply speculation because such powders are unavailable and if tried would be very expensive to manufacture.

The general nature of the invention having been set forth, the following examples are presented as specific illustrations thereof. It will be understood that the invention is not limited to these specific examples but is susceptible to various modifications that will be recognized by one of ordinary skill in the art.

EXAMPLE 1

The described method was used to produce Ag Coated $YBa_2Cu_3O_{7-x}$ (123) high temperature superconducting (HTS) powder in various weight percentages of silver. The steps in accomplishing this are given as follows:

(a) 7.5 grams of $AgNO_3$ were dissolved into 10 grams of ethylene glycol.

(b) A 4 gram portion of this solution was thoroughly mixed into 10 grams of 123 HTS powder to form a paste. The glycolcarrier was carefully evaporated leaving the $123/AgNO_3$ mixture. This mixture was heated to 450° C. in air in an oven for 20 minutes to decompose the $AgNO_3$ The total sample weight after decomposition, 11.714 grams, indicated a weight fraction of silver of $1.714/11.714 = 14.6\%$.

(c) The remainder of the original $AgNO_3$ glycol solution was diluted 2:1 with additional glycol. Following the same procedure as in (b) produced a measured weight of 10.857 grams. The fraction of silver was $0.857/10.857 = 7.9\%$.

Figure 1B:
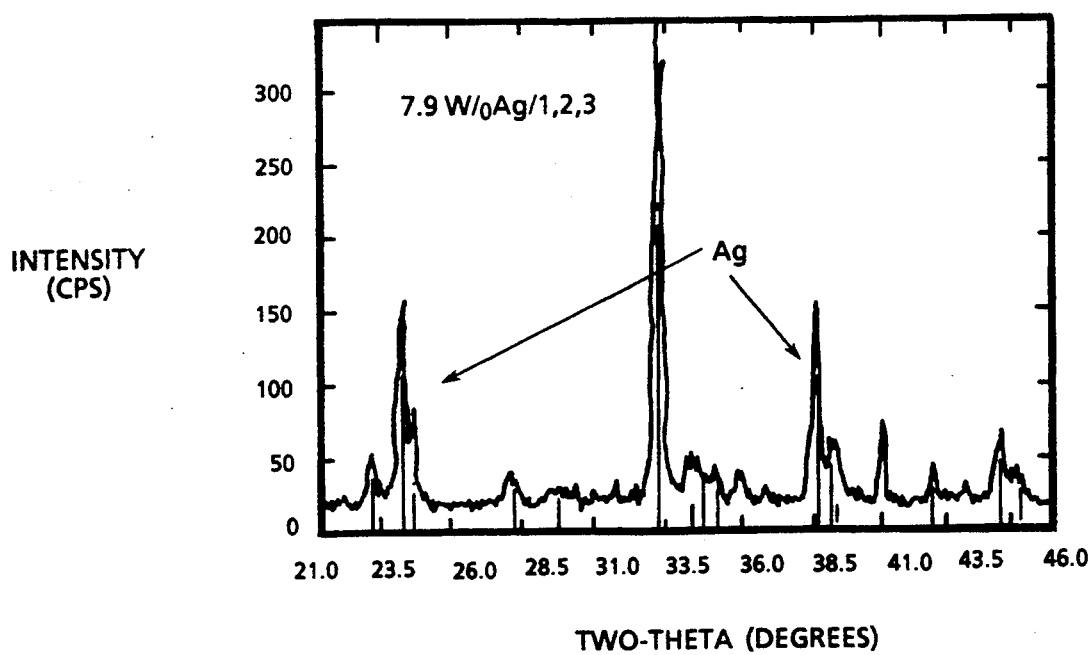
Figure 1C:
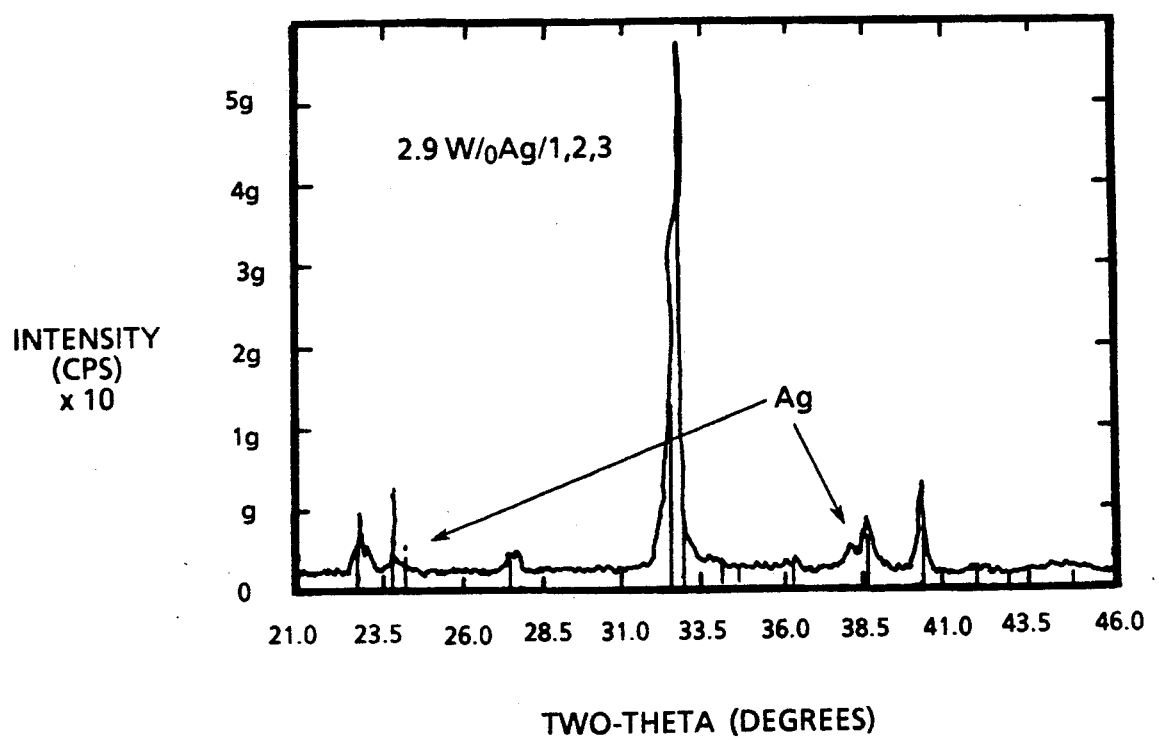

(d) Further dilution following the same procedure produced silver fractions of 4.1% and 2.09%, respectively. Visual inspection and X-ray spectroscopy indicated a quite uniform distribution of the silver. Powder X-ray spectra of the 14.6%, 7.9% and 2.09% samples are shown in FIGS. 1A, 1B, and 1C, respectively. The progressive growth of the Ag peaks are indicated.

EXAMPLE 2

A quantity of $YBa_2Cu_3O_{7-x}$ (123) high temperature superconducting (HTS) powder was coated with 15 weight % silver by applying the method as follows:

(a) 20 grams of 123 HTS powder was weighed. The proportion $0.15 = X/(20+X)$ was used to compute the amount of Ag necessary in the sample. This was 3.53 grams. The corresponding amount of $AgNO_3$ required for this weight of Ag after decomposition is obtained from the fraction of molecular weight $108/170 = 3.53/X$. $X = 5.55$ grams $AgNO_3$.

(b) The mixture was heated to about 250° C. on a hot plate while stirring to wet thoroughly the entire body of powder with the liquid $AgNO_3$. The sample was placed subsequently in a furnace in air at 460° C. for 20 minutes to decompose the $AgNO_3$.

Figure 2A:
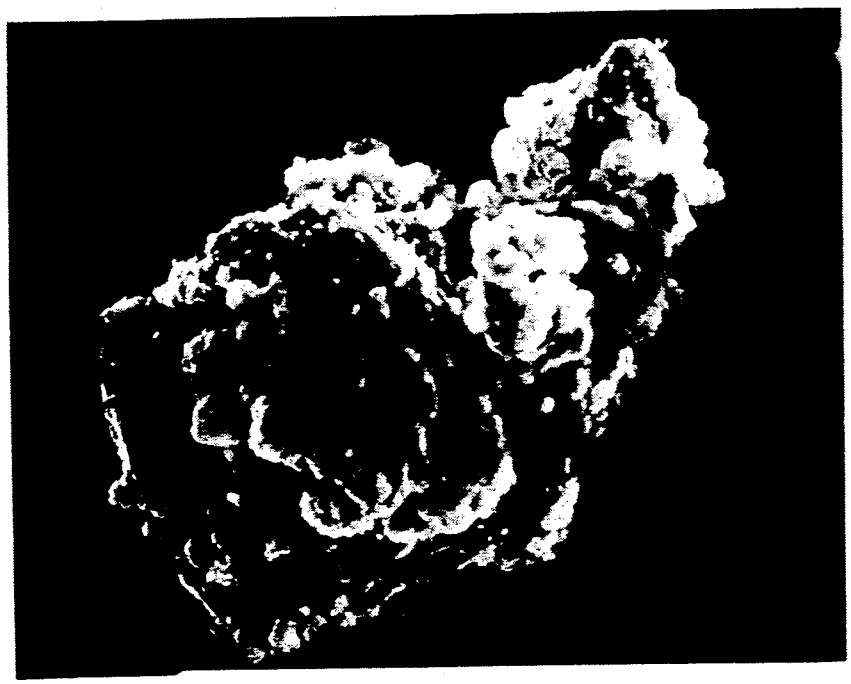
FIGS. 2A and 2B present SEM photographs ($5,000\times$) of uncoated (FIG. 2A) and silver metal coated (FIG. 2B) particles of $YBa_2Cu_3O_{7-x}$ high temperature superconducting ceramic powder and are discussed in example 2.
Figure 2B:
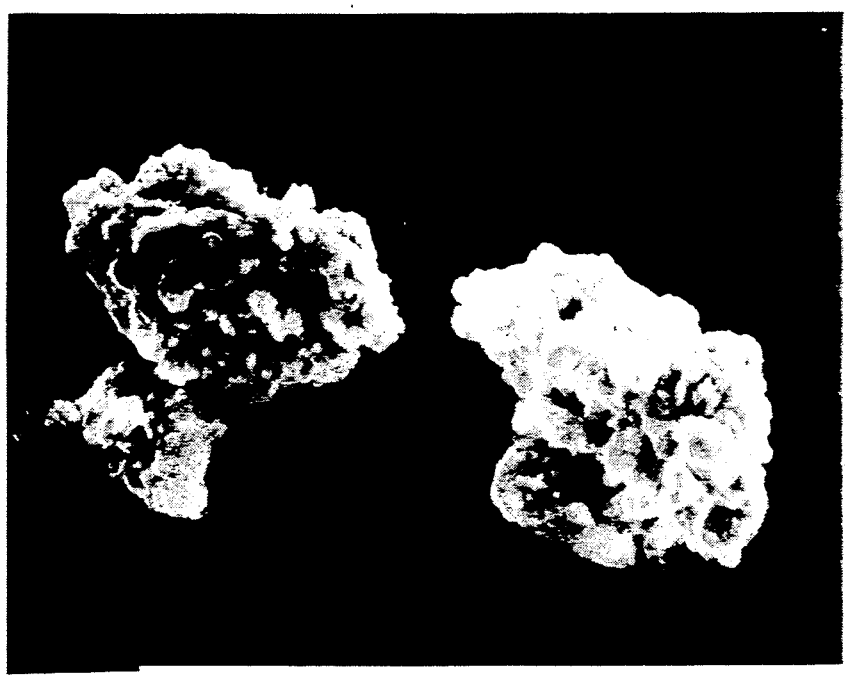

(c) The final product appeared uniform in Ag coating by microscopic observation. FIG. 2A shows a scanning electron microscope (SEM) photograph of the uncoated, as received particles of 123 HTS powder (MAG:5,000×) and FIG. 2B shows a SEM photograph of the Ag metal coated particles of 123 HTS powder (MAG:5,000×). A notable feature is the filling of micropores observable in the uncoated particles (FIG. 2A) by a smooth layer of silver metal (FIG. 2B).

EXAMPLE 3

Approximately 10 grams of 15% 123/Ag powder (example 2) was packed into a ¼" outside diameter (OD) 0.030" wall silver tube and swaged down to 0.155 inch. The silver tube was removed from a portion of the tube by grinding.

The removed portion of HTS 123/Ag rod was annealed in $O_2$ atmosphere overnight at 925° C. and subsequently tested for superconducting properties. It was found to have a superconducting transition temperature Tc ~93° K. and a superconducting current density capability (Jc) of 125 amps/cm$^2$.

Figure 3:
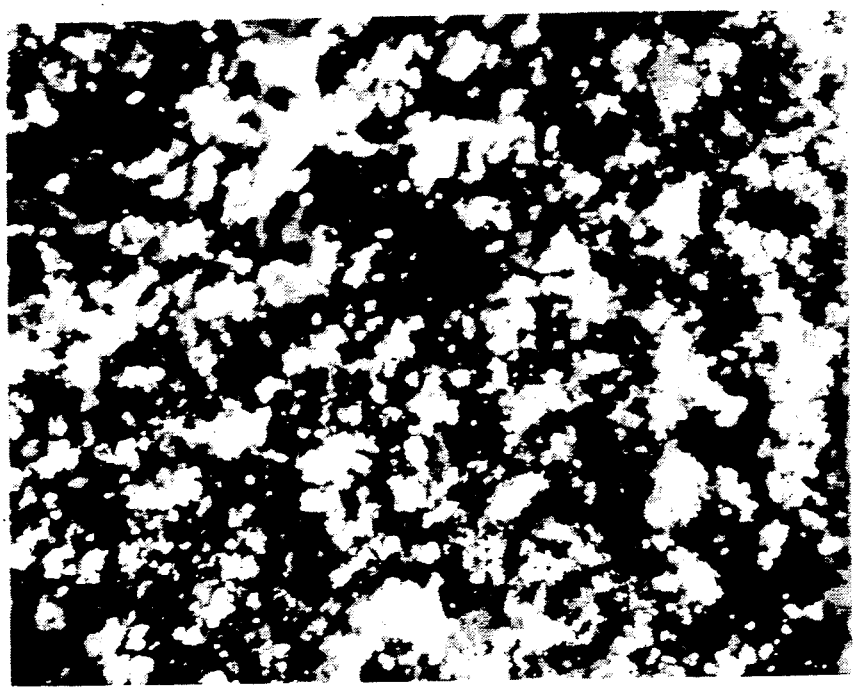
FIG. 3 is an optical micrograph at $400\times$ magnification of a consolidated composite wire cross section morphology wherein the wire was form according to the process of example 3 from the silver coated ceramic particles (FIG. 2B) of example 2.

The optical micrograph (FIG. 3) at 400× magnification shows the consolidated composite wire cross section morphology under these conditions of processing.

EXAMPLE 4

Five (5) grams of good quality $YBa_2Cu_3O_{7-x}$ high temperature superconducting powder was placed in a crucible which was then inserted into a coffee pot furnace and maintained at approximately 350° C., A measure quantity (1.39 grams) of $AgNO_3$ (at ambient temperature) was sprinkled onto the heated $YBa_2Cu_3O_{7-x}$ powder while stirring in order to melt and spread the molten $AgNO_3$ onto the $Ba_2Cu_3O_{7-x}$ powder. The mixture then was transferred to a furnace and heated to ~500° C. for about 15 minutes to decompose the $AgNO_3$. The powder was reweighed to verify that Ag had been deposited. The powder was examined under a low power microscope. The Ag was observed to have deposited. There was, however, a considerable degree of nonuniformity. There were obviously Ag rich areas and small lumps of Ag scattered in the powder mass.

EXAMPLE 5

Five (5) grams of $YBa_2Cu_3O_{7-x}$ high temperature superconductor powder was placed in a crucible on a hot plate and maintained at 290° C. A measured quantity (1.39 grams) of $AgNO_3$ was placed in a beaker also on the hot plate. After the $Ba_2Cu_3O_{7-x}$ powder and $AgNO_3$ reached temperature, the liquid $AgNO_3$ was poured onto the powder while stirring. The mixture then was placed in a furnace at $\sim 500°$ C. for about 15 minutes to decompose the $AgNO_3$. The material was reweighed to verify the deposition of Ag. Examination under a low power microscope revealed reasonably uniform Ag coating of the particles, but with noticeable agglomeration/Ag rich areas. With optimum pour and mixing rates, this technique probably would be capable of producing an acceptable product.

Obviously, numerous modifications and variations of the present invention are possible in light of the above teachings. It is therefore to be understood that within the scope of the appended claims the invention may be practiced otherwise than as specifically described herein.

What is claimed is:

1. A process for coating superconducting ceramic powders with silver metal comprising:
   (1) mixing $AgNO_3$ with superconducting ceramic powder;
   (2) heating the $AgNO_3$ superconducting ceramic powder mixture at a temperature above the melting point of $AgNO_3$ but below the decomposition temperature of $AgNO_3$ until the $AgNO_3$ melts and forms a uniform coating over the surfaces of the superconducting ceramic particles; and
   (3) heating the molten $AgNO_3$-coated superconducting ceramic powder at a temperature from the decomposition temperature of $AgNO_3$ to 50° C. below the melting point of the superconducting ceramic powder until the $AgNO_3$ decomposes to form a thin, uniform coating of silver metal over the surfaces of the superconducting ceramic powder particles;
   wherein an amount of $AgNO_3$ is used in step (1) which will produce upon decomposition a silver metal coated superconducting ceramic powder composite comprising from 10 to 25 weight percent silver metal with the remainder being the superconducting ceramic.

2. The process of claim 1 wherein in step (1) the $AgNO_3$ and the superconducting ceramic powder are each at a temperature of below the melting point of $AgNO_3$.

3. The process of claim 2 wherein the $AgNO_3$ is a powder.

4. The process of claim 1 wherein in step (1) the $AgNO_3$ is a liquid at a temperature above the melting point of $AgNO_3$ but below the decomposition temperature of $AgNO_3$ and the superconducting ceramic powder is at a temperature below the decomposition temperature of $AgNO_3$ and wherein the liquid $AgNO_3$ and the superconducting ceramic powder are mixed together with vigorous agitation.

5. The process of claim 4 wherein the liquid $AgNO_3$ is added to the superconducting ceramic powder.

6. The process of claim 4 wherein the superconducting powder is added to the liquid $AgNO_3$.

7. The process of claim 4 wherein the superconducting ceramic powder is at a temperature above the melting point of $AgNO_3$ and below the decomposition temperature of $AgNO_3$ in step (1).

8. The process of claim 4 wherein the superconducting ceramic powder is at a temperature below the melting point of $AgNO_3$ in step (1).

9. The process of claim 1 wherein in step (1) solid $AgNO_3$ is added to the superconducting ceramic powder which is maintained at a temperature above the melting point of $AgNO_3$ and below the decomposition temperature of $AgNO_3$ and wherein the superconducting ceramic powder is vigorously agitate in step (1).

* * * * *